United States Patent
Pilo et al.

(10) Patent No.: US 12,308,091 B2
(45) Date of Patent: May 20, 2025

(54) PSEUDO-2-PORT MEMORY WITH DUAL PRE-CHARGE CIRCUITS

(71) Applicant: Synopsys, Inc., Mountain View, CA (US)

(72) Inventors: Harold Pilo, Underhill, VT (US); Michael Myungho Lee, Burlington, VT (US); Vijit Gadi, Noida (IN)

(73) Assignee: Synopsys, Inc., Sunnyvale, CA (US)

( * ) Notice: Subject to any disclaimer, the term of this patent is extended or adjusted under 35 U.S.C. 154(b) by 348 days.

(21) Appl. No.: 17/643,038

(22) Filed: Dec. 7, 2021

(65) Prior Publication Data
US 2022/0208239 A1 Jun. 30, 2022

Related U.S. Application Data

(60) Provisional application No. 63/132,548, filed on Dec. 31, 2020.

(51) Int. Cl.
*G11C 8/16* (2006.01)
*G11C 7/12* (2006.01)

(52) U.S. Cl.
CPC . *G11C 8/16* (2013.01); *G11C 7/12* (2013.01)

(58) Field of Classification Search
CPC ....... G11C 8/16; G11C 7/12; G11C 2207/002; G11C 2207/2209; G11C 7/1075; G11C 7/22; G11C 11/412; G11C 11/413; G11C 11/419
See application file for complete search history.

(56) References Cited

U.S. PATENT DOCUMENTS

| | | | |
|---|---|---|---|
| 10,916,275 B1* | 2/2021 | Ghosh | G11C 11/419 |
| 11,100,965 B1* | 8/2021 | Sisodia | G11C 8/08 |
| 2009/0303819 A1* | 12/2009 | Park | G11C 5/147 |
| | | | 365/230.06 |
| 2013/0039135 A1 | 2/2013 | Kang et al. | |
| 2014/0140158 A1* | 5/2014 | Lum | G11C 11/419 |
| | | | 365/203 |
| 2015/0109865 A1 | 4/2015 | Gulati et al. | |
| 2016/0211013 A1* | 7/2016 | Harada | G11C 7/12 |

(Continued)

FOREIGN PATENT DOCUMENTS

EP 3482395 A1 5/2019

OTHER PUBLICATIONS

International Application No. PCT/US2021/062153, International Search Report and Written Opinion dated Mar. 21, 2022.

(Continued)

*Primary Examiner* — Sung Il Cho
(74) *Attorney, Agent, or Firm* — Patterson + Sheridan, LLP (57) ABSTRACT

A memory circuit system and method for using the same are provided. In one example, the memory circuit system includes a memory array, a first precharge circuit, and a second precharge circuit. The memory array writes a first set of columns of the memory array. The first precharge circuit charges bitlines of a second set of columns of the memory array while bitlines of the first set of columns discharge. The first set of columns is different from the second set of columns. The second precharge circuit charges the bitlines of the first set of columns after the memory array has finished writing the first set of columns.

20 Claims, 7 Drawing Sheets

(56) References Cited

U.S. PATENT DOCUMENTS

2016/0329092 A1\* 11/2016 Akerib ................. G11C 11/418
2022/0093171 A1\* 3/2022 Jung ....................... G11C 7/18

OTHER PUBLICATIONS

International Application No. PCT/US2021/062153, International Preliminary Report on Patentability dated Jul. 13, 2023.
European Application No. 21836702.7 Office Action dated Feb. 24, 2025.

\* cited by examiner

PSEUDO-2-PORT MEMORY WITH DUAL PRE-CHARGE CIRCUITS

CROSS-REFERENCE TO RELATED APPLICATIONS

This application claims priority to and the benefit of U.S. Provisional Patent Application Ser. No. 63/132,548, entitled "Pseudo-2-Port Memory with Improved Cycle Time," filed Dec. 31, 2020, which is incorporated herein by reference in its entirety.

TECHNICAL FIELD

The present disclosure generally relates to a memory circuit, and specifically, to a system and method for providing a pseudo 2-port memory (P2P) with dual pre-charge circuits.

BACKGROUND

Pseudo-2-port (P2P) memories are widely used in graphics processing units (GPUs) and high-performance networking system on chips (SoCs). P2P memories provide a single-clock two-port function using a one-port cell (e.g., a 6-transistor (6T)-1port static random access memory (SRAM) bitcell). P2P memories may replace two port (2P) memories (e.g., 2P memories that use 8T bitcells) to halve the area footprint. Unlike 2P memories that have independent asynchronous clocks, P2P memories operate with one single clock. To emulate the 2P function, one read operation and one write operation occur in one clock cycle to two different addresses.

Typically, P2P memories are internally double-clocked and self-timed—read and write operations are carefully timed internally to minimize delays between the two operations and to maximize operating frequency. Although P2P memories cannot achieve the frequency of the true 2P memories being replaced, SoC designers continue to require fastest performance as can be achieved.

SUMMARY

A memory circuit system and method are described herein. According to an embodiment, a memory circuit system includes a memory array, a first precharge circuit, and a second precharge circuit. The memory array writes a first set of columns of the memory array. The first precharge circuit charges bitlines of a second set of columns of the memory array while bitlines of the first set of columns discharge. The first set of columns is different from the second set of columns. The second precharge circuit charges the bitlines of the first set of columns after the memory array has finished writing the first set of columns.

In some embodiments, the second set of columns are not written when the first set of columns are being written.

The memory array may read a subset of one or more of the first set of columns and the second set of columns before writing the first set of columns. The memory array may read the subset of one or more of the first set of columns and the second set of columns and write the first set of columns in a single clock cycle. Reading the subset of one or more of the first set of columns and the second set of columns and writing the first set of columns may be performed over a same port of the memory array.

The first set of columns are written after the bitlines of the first set of columns discharge.

The first precharge circuit and the second precharge circuit may charge the bitlines of the second set of columns and the first set of columns, respectively, to a same voltage.

According to another embodiment, a method for writing a memory array includes writing a first set of columns of the memory array and charging, using a first precharge circuit, bitlines of a second set of columns of the memory array while bitlines of the first set of columns discharge. The first set of columns different from the second set of columns. The method also includes charging, using a second precharge circuit, the bitlines of the first set of columns after the first set of columns are finished being written.

The second set of columns may not be written when the first set of columns are being written.

The method may include reading a subset of one or more of the first set of columns and the second set of columns before writing the first set of columns. The method may include reading the subset of one or more of the first set of columns and the second set of columns and writing the first set of columns in a single clock cycle. Reading the subset of one or more of the first set of columns and the second set of columns and writing the first set of columns may be performed over a same port of the memory array.

The first set of columns may be written after the bitlines of the first set of columns discharge.

The method may include charging, using the first precharge circuit and the second precharge circuit, the bitlines of the second set of columns and the first set of columns, respectively, to a same voltage.

The method may include continuing to charge, using the first precharge circuit, the bitlines of the second set of columns of the memory array after the memory array has finished writing the first set of columns.

According to another embodiment, a memory circuit includes a first transistor and a second transistor. The first transistor is connected to a bitline of a first column of a memory array. The second transistor is connected to a bitline of a second column of the memory array. After initiation of a write operation to write the second column, a gate of the first transistor receives a first control signal that causes the first transistor to charge the bitline of the first column. After completion of the write operation, a gate of the second transistor receives a second control signal that causes the second transistor to charge the bitline of the second column.

The first column may not be written during the write operation.

The bitline of the second column may discharge before the second column is written.

The first transistor may continue charging the bitline of the first column while the second column is being written.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to a pseudo-2-port (P2P) memory with dual pre-charge circuits that provide improved cycle time in certain embodiments. The dual precharge circuits charge bitlines for columns in the memory at different times. At the end of a read operation, the first precharge circuit charges bitlines of the columns that will not be written during the write operation. The write operation may be initiated while the first precharge circuit charges these bitlines. After the write operation is complete, the second precharge circuit charges bitlines for the columns in the memory that were written during the write operation. In this manner, the write operation can commence before the bitlines for the columns that are not written have been charged. As a result, the write operation can finish sooner and the cycle time of the P2P memory is reduced, in certain embodiments.

The P2P memory uses a dual precharge bitline scheme that enables early discharge of bitlines for the write operation. The early discharge of bitlines reduces the required write wordline (WL) pulse width, which in turn, reduces the P2P cycle time. A cycle time reduction of 12% can be achieved with memories with high number of rows and narrow bits, in certain embodiments. The dual precharge bitline decouples the read completion from the start of the write cycle so that bitlines can start discharging after a sense-amp is isolated.

Figure 1:
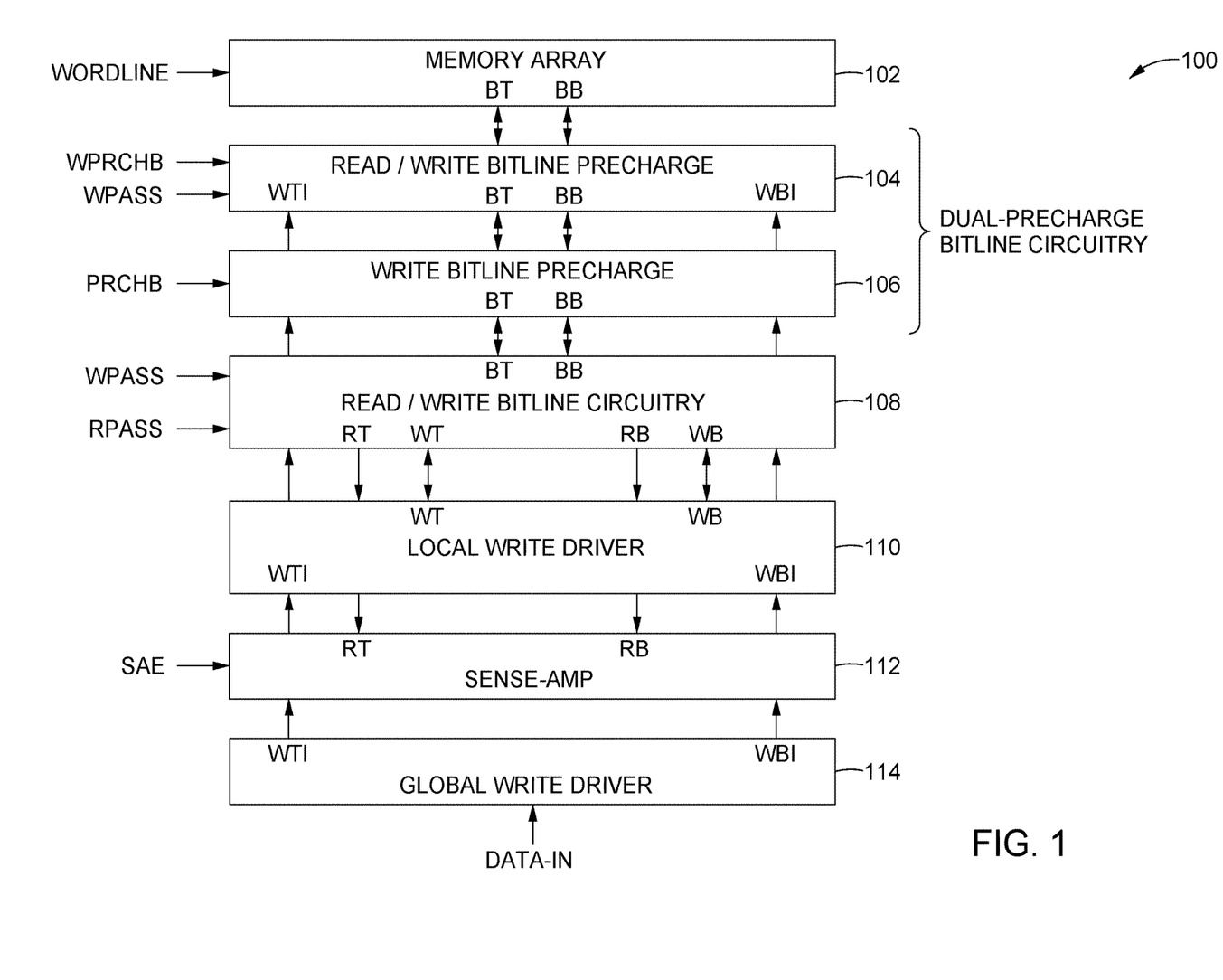
FIG. 1 illustrates an example memory circuit system, according to an embodiment of the present disclosure.

FIG. 1 illustrates an example memory circuit system 100. As seen in FIG. 1, the memory circuit system 100 includes a memory array 102, a first precharge circuit 104, a second precharge circuit 106, read/write bitline circuitry 108, a local write driver 110, a sense amplifier (sense-amp) 112, and a global write driver 114. The first precharge circuit 104 and the second precharge circuit 106 charge bitlines of different columns in the memory array 102 (e.g., a 6T bitcell array) at different times of a read/write cycle. In particular embodiments, this charging shortens the write portion of the read/write cycle, which reduces the cycle time of the system 100.

Generally, a read operation occurs first in a clock cycle. During the read operation, columns of the memory array 102 are read out. The write operation begins after the read operation is complete. Some of the columns that are read out during the read operation may be the same as or different from the columns that are written during the write operation. The read operation and the write operation may both occur during a single clock cycle. The memory array 102 is configured to write to bitlines of a first set of columns in the memory array. The first precharge circuit 104 charges bitlines of a second set of columns in the memory array 102 that are not going to be written during the write operation. While the bitlines of the second set of columns are charging, the write operation begins and the bitlines of the first set of columns that are going to be written discharge. After the write operation is complete, the second precharge circuit 106 charges the bitlines of the first set of columns of the memory array 102 that were written during the write operation.

The dual precharge bitline circuitry (e.g., the precharge circuits 104 and 106) is inserted in the column circuitry. Write bitline precharge (e.g., the second precharge circuit 106) activates after the completion of the write operation to recover bitlines back to a voltage supply ($V_{DD}$) in preparation of the next cycle's read operation. In some embodiments, the read/write bitline precharge (e.g., the first precharge circuit 104) is activated both (i) during the period between the read and write operations (intra-cycle separation) to charge bitlines of the columns that are not being written and (ii) after the completion of the write operation to aid in the recovery of bitlines of columns that were written back to $V_{DD}$ (this is in parallel to the second precharge circuit 106 charging the bitlines of columns that were written). The first precharge circuit 104 receives an intra-cycle/write precharge signal (WPRCHB), and the second precharge circuit 106 receives a write-only precharge signal (PRCHB).

The first precharge circuit 104 and the second precharge circuit 104 charge and discharge different bitlines of columns in the memory array 102 using the Bitline-Bar (BB) and Bitline-True (BT) signals. BB and BT may include several different signals that each control the charging or discharging of a bitline of a column in the memory array 102. For example, a 0th bitline may be charged and discharged according to a BB0 signal and a BT0 signal, while a 1st bitline may be charged and discharged according to a BB1 signal and a BT1 signal. For the nth bitline, the BBn signal may be used to charge and discharge the bitline when the value of the bitline is zero, and the BTn signal may be used to charge and discharge the bitline when the value of the bitline is one.

The read/write bitline circuitry 108, local write driver 110, sense-amp 112, and global write driver 114 operate to control the read and write operations in the memory array 102 (e.g., the data that is read out from or written into the memory array 102, the timing and duration of the read and write operations, when the precharge operations of the precharge circuits 104 and 106 occur, etc.). The global write driver 114 may receive data to be written to the memory array 102. The global write driver 114 also provides Global Write Bar (WBI) and Global Write True (WTI) signals to other components in the system 100 (e.g., the local write driver 110, and the first precharge circuit 104). The local write driver 114 communicates local write data line bar (WB) and local write data line true (WT) to the read/write bitline circuitry 108 based on WBI and WTI. The read/write bitline circuitry 108 may read data from the bitlines (BB/BT) and transfers that data to local read data line bar (RB) and local read data line true (RT), which are communicated to the sense-amp 112. The read/write bitline circuitry 108 also receives Write Passgate Control (WPASS) and Read Passgate Control (RPASS). WPASS is also provided to the first precharge circuit 104. RPASS and WPASS are provided by bank-control blocks (not shown in FIG. 1). RPASS is used to select a read bitline to pass from BB/BT to RB/RT. WPASS selects a bitline to be written from WBI/WTI to BB/BT.

The sense-amplifier (sense-amp) 112 may be activated or deactivated by an enable signal (SAE). For example, the sense-amp 112 may be deactivated when the SAE is low.

The sense-amp 112 receives as input RB and RT from the read/write bitline circuitry 108. RB and RT may have a small differential signal that is amplified by the sense-amp 112 to full logic levels (ground (VSS) and $V_{DD}$) so that they can be driven out to downstream logic. Amplification of the read Bitline signal and isolation of the sense-amp from the write operation prevents signal corruption during the read operation. The sense-amp 112 may be isolated from the bitlines using RPASS or SAE. For example, when RPASS is high or SAE is low, the sense-amp 112 is considered isolated from the bitlines.

Figure 2:
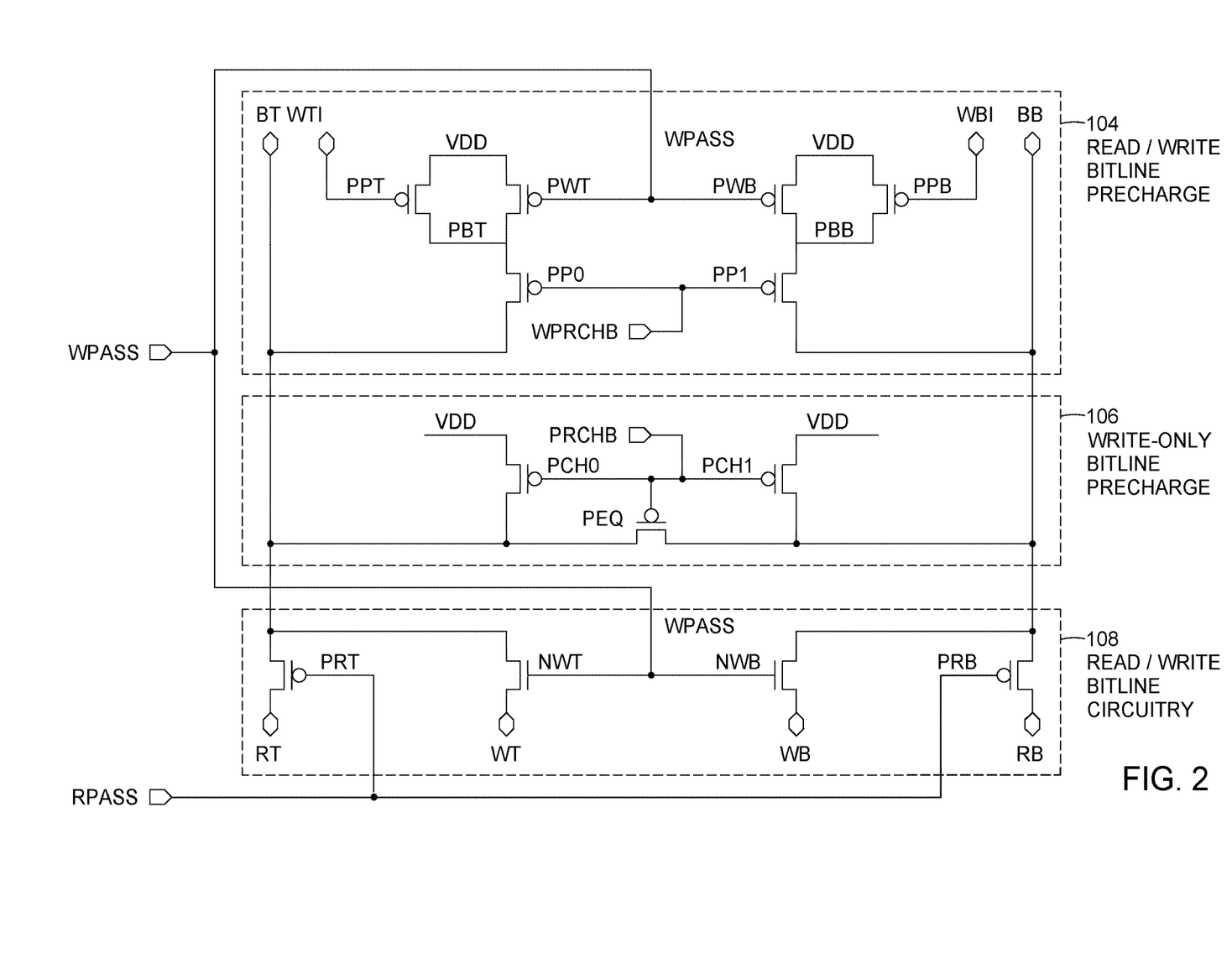
FIG. 2 illustrates example components of the system of FIG. 1, according to an embodiment of the present disclosure.

FIG. 2 illustrates example components of the system 100 of FIG. 1. Read/Write bitline circuitry 108 activates the bitline precharge between the read and write WL activation (intra-cycle). During the intra-cycle period, WPRCHB goes low shortly after read bit switch (RPASS) shuts off (and sense-amp deactivation or isolation) to initiate precharge of bitlines that are not selected for writing (e.g., by activating the first precharge circuit 104). Placement of positive-field effect transistor (PFET) devices PP0/PP1 below the WPASS/WBI/WTI-controlled PFETs to ensure that during the read portion of the cycle, the read/write precharge network is entirely isolated from the bitlines (e.g., WPRCHB is high).

Three possible operations are controlled with the read/write bitline precharge circuitry 104:

1. Early write operation on selected columns: WPASS goes high for selected columns for writing to initiate the early discharge of BT (Write-0) or BB (Write-1). The early bitline discharge is possible given RPASS is shut off and the sense-amp is deactivated or isolated from bitlines (e.g., completion of read sensing happens in the background while bitlines are writing). Interlock circuitry (not shown) ensures WPASS turns on shortly after RPASS shuts off to initiate early bitline discharge. Global write signals WTI/WBI (PFETs PPT/PPB) provide bitline precharge for complement bitlines. For example, for a Write-1 operation, WPASS is high, WB/WT are low/high, WTI/WBI are low/high, respectively. BB discharges to $V_{SS}$ through negative-field effect transistor (NFET) NWB, while BT is precharged to $V_{DD}$ through PFETs PPT/PP0.

2. Bit Write Operation (no write operation): During bit-write, bit masking for an input/output in the memory array 102 is performed, which allows selective bits to be written while others are not. WTI/WBI global write data signals are kept low and WT/WB are kept high. Both BB and BT precharge to $V_{DD}$ through PFET devices PPB/PP1 and PPT/PP0, respectively.

3. Unselected columns during write operation: For unselected columns during the write operation, WPASS signal remains low. This ensures both BB/BT are precharged to $V_{DD}$ during the intra-cycle period (PWT/PWB/PP0/PP1 all on), which, in SRAM, prevents bitcell corruption during write WL activation.

During the intra-cycle period, WPRCHB is low and PRCHB is high. As a result, PP0 and PP1 (whose gates receive the control signal WPRCHB) are turned on and PCH0 and PCH1 (whose gates receive the control signal PRCHB) are turned off. If the bitlines for columns that are not going to be written are connected to PP0 or PP1, then these bitlines are charged through PP0 or PP1. If bitlines for columns that are going to be written are connected to PP0 or PP1, then these bitlines may begin early discharge through NWT or NWB, because PP0 or PP1 for these bitlines may be turned off. After the write operation is complete, PRCHB also goes low, which turns on PCH0 and PCH1. As a result, the bitlines for the columns that were written charge to $V_{DD}$ through PCH0 and PCH1. In some embodiments, the bitlines for columns that are not going to be written continue to be charged through PP0 or PP1 when the columns that are going to be written are being written. In these embodiments, WPRCHB remains low even after the columns that are going to be written have started being written.

Figure 3:
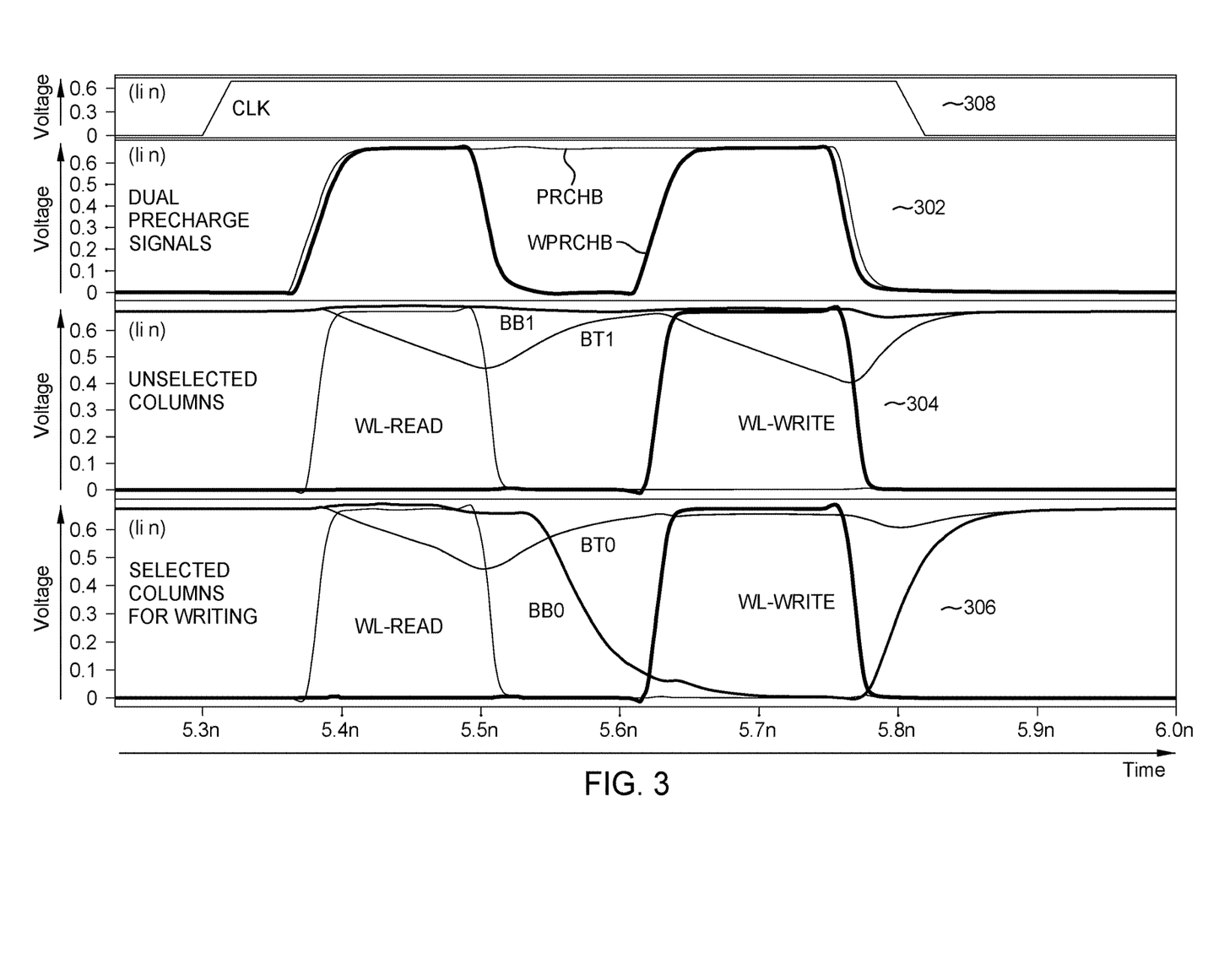
FIG. 3 illustrates example waveforms in the system of FIG. 1, according to an embodiment of the present disclosure.

FIG. 3 illustrates example waveforms 302, 304, and 306 during a clock cycle (shown in a waveform 308) in the system 100 of FIG. 1. In the example of FIG. 3, a 0th bitline (BB0/BT0) is selected for writing and a 1st bitline (BB1/BT1) is not selected for writing. The waveform diagram 302 shows the write-only precharge signal (PRCHB) and the intra-cycle/write precharge signal (WPRCHB). For unselected columns during the write operation (shown in the waveform diagram 304), BB1 and BT1 are precharged to $V_{DD}$ prior to Write WL selection. The bitline holds a 1 value, and thus, BT1 discharges when WL-READ and WL-WRITE are high while BB1 does not change. For selected columns for writing (shown in waveform diagram 306), BB0 is discharged shortly after the sense-amp is isolated and RPASS goes high. BB0 reaches to near-$V_{SS}$ level prior to WL activation and WL pulse width can then be reduced for cycle time improvement.

As seen in the waveform diagram 304, the bitlines for columns that are not written during the write operation are charged by the first precharge circuit 104 (as evidenced by BT1 being charged). As these bitlines are being charged, the write operation begins (as evidenced by BB0 being discharged in the bottom waveform diagram). When the write operation is complete, the second precharge circuit 106 charges the bitlines for the columns that were written during the write operation (as evidenced by BB0 being charged after WL-Write goes low). The first precharge circuit 104 may also be used at this time to charge the bitlines for the columns that were written during the write operation and the bitlines for the columns that were not written. Furthermore, as seen in FIG. 3, the read and write operations both occur in a single clock cycle (as shown by the clock pulse in the diagram 308). Additionally, the read and write operations occur to a single port of the memory array.

Figure 4:
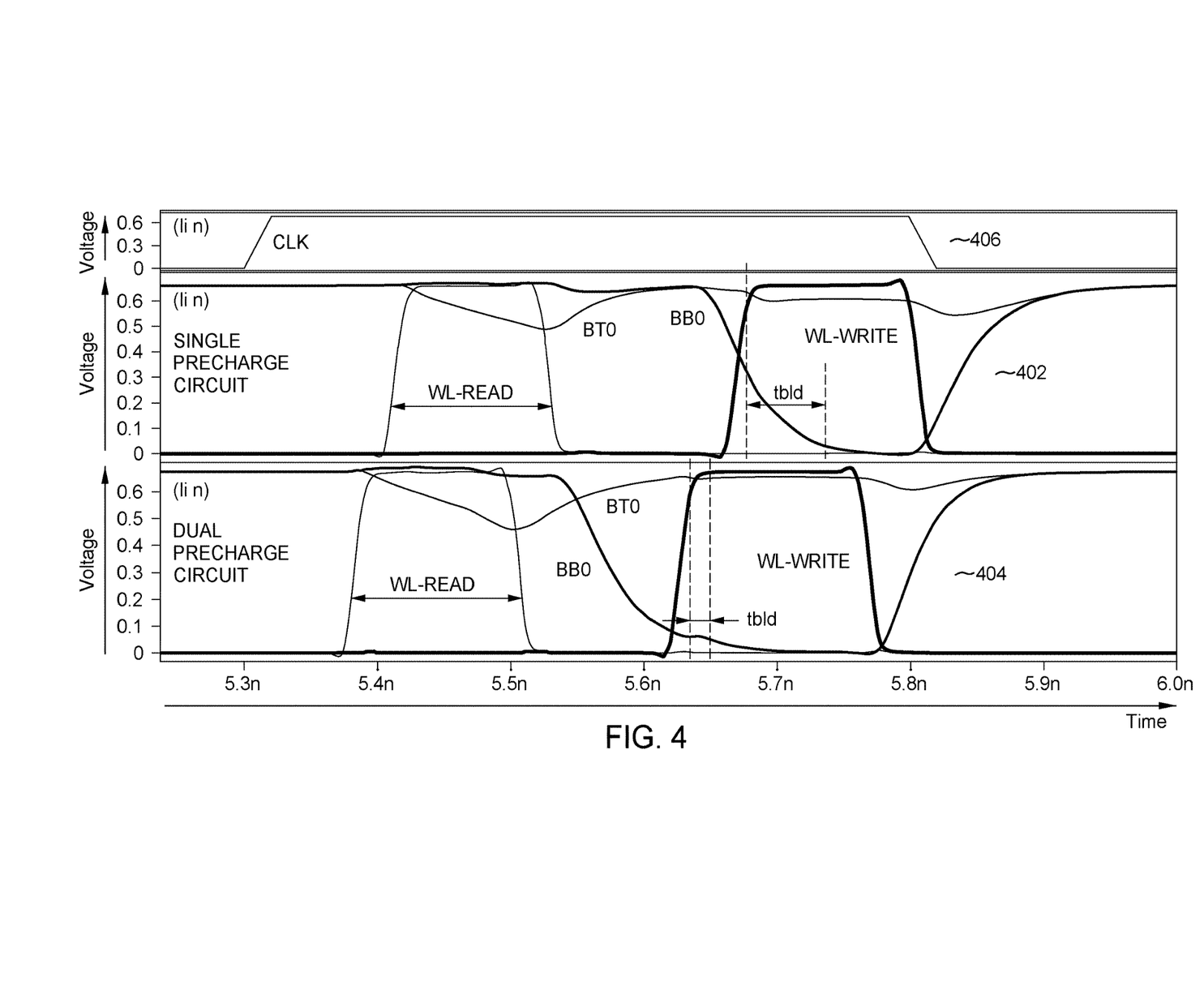
FIG. 4 illustrates an example comparison of waveforms, according to an embodiment of the present disclosure.

FIG. 4 illustrates an example comparison of waveforms 402 and 404 across a clock cycle (shown in a waveform 406). The waveform 402 shows a read/write cycle when there is only one precharge circuit. As seen in that waveform 402, the write operation does not begin until all bitlines are charged (as shown by BB0 not discharging until BT0 is charged). The Read/Write bitline precharge circuit is activated between the self-timed read and write operation to precharge bitlines back to $V_{DD}$ prior to write cycle WL activation. This is required to prevent bitline level from corrupting memory contents during the write operation for columns that are not writing (such as bit-write operation or non-column selected bitlines during write cycle). Read/Write bitline precharge circuitry is also activated after the end of the write operation to drive bitlines back to $V_{DD}$ in preparation of the next clock cycle. In the top waveform, the write operation starts with WL activation and simultaneous bitline (BB0) discharge to $V_{SS}$ to initiate the write into the bitcell. As can be seen, there is a significant slew in BB0 that delays the transition to a near-$V_{SS}$ level. The timing from the WL activation to the BB0 discharge is denoted as tbld. After BB0 reaches the near-$V_{SS}$ level, sufficient WL delay is provided for successful writing of the bitcell.

The waveform 404 shows a read/write cycle when there are two precharge circuits, as in the system 100 of FIG. 1. As seen in that waveform 404, the write operation begins before the bitlines for the columns that are not written are charged (as shown by BB0 discharging before BT1 is charged). In the waveform 404, the BB0 transition starts much earlier prior to WL activation when compared to the BB0 transition in the waveform 402. As a result of the early BB0 transition, the tbld timing from the WL to BB0 reaching the near-$V_{SS}$ level is much shorter compared to the tbld timing in the waveform 402. Subsequently, the duration of the write WL can be significantly reduced.

Figure 5:
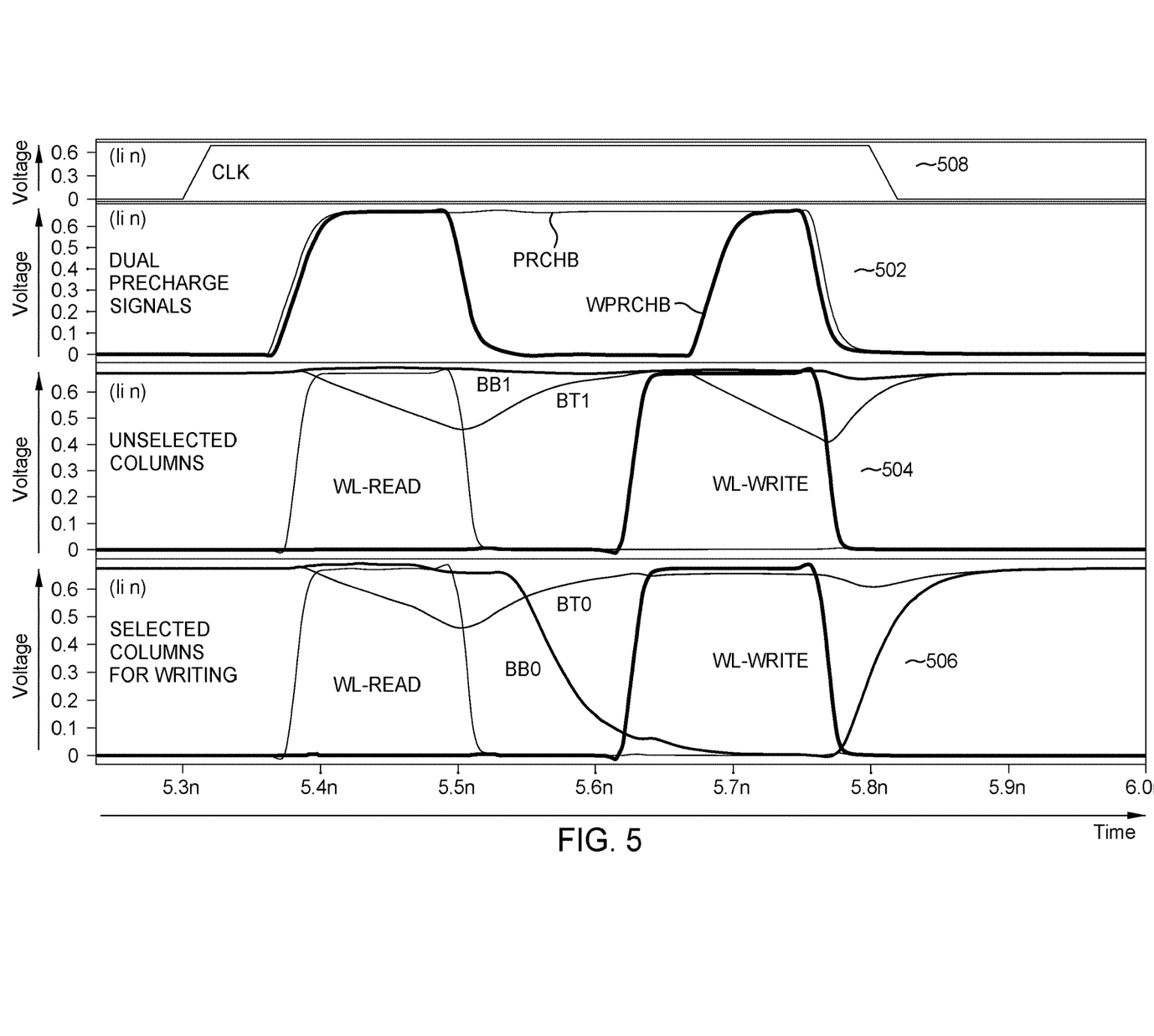
FIG. 5 illustrates example waveforms in the system of FIG. 1, according to an embodiment of the present disclosure.

FIG. 5 illustrates example waveforms 502, 504, and 506 during a clock cycle (shown in a waveform 508) in the system 100 of FIG. 1. Generally, the waveforms 502, 504, and 506 in FIG. 5 show an alternative charging scheme relative to the one shown in FIG. 3. Similar to the charging scheme shown in FIG. 3, for unselected columns during the write operation (waveform 504), BB1 and BT1 are precharged to $V_{DD}$ prior to Write WL selection. For selected columns for writing (waveform 506), BB0 is discharged shortly after the sense-amp is isolated (RPASS goes high). BB0 reaches to near-$V_{SS}$ level prior to WL activation and WL pulse width can then be reduced for cycle time improvement. Unlike the charging scheme shown in FIG. 3, BT1 continues charging after Write WL activation, as shown by BT1 continuing to be at $V_{DD}$ after WL-WRITE goes high. To continue the charging of BT1, WPRCHB remains activated even after Write WL activation. WPRCHB shuts off (e.g., goes high) some time after Write WL activation, and BT1 begins to discharge. After WL-WRITE goes low, BT1 and BB0 begin charging back to $V_{DD}$. In the precharging scheme of FIG. 5, the precharge window for BT1 has been extended into the write cycle such that the charge cycle overlaps with Write WL activation. The write window for write-selected columns is not reduced in certain embodiments. Moreover, the pulse width for the charge signal(s) is widened in some embodiments, which may improve the cycle separation margin.

Figure 6:
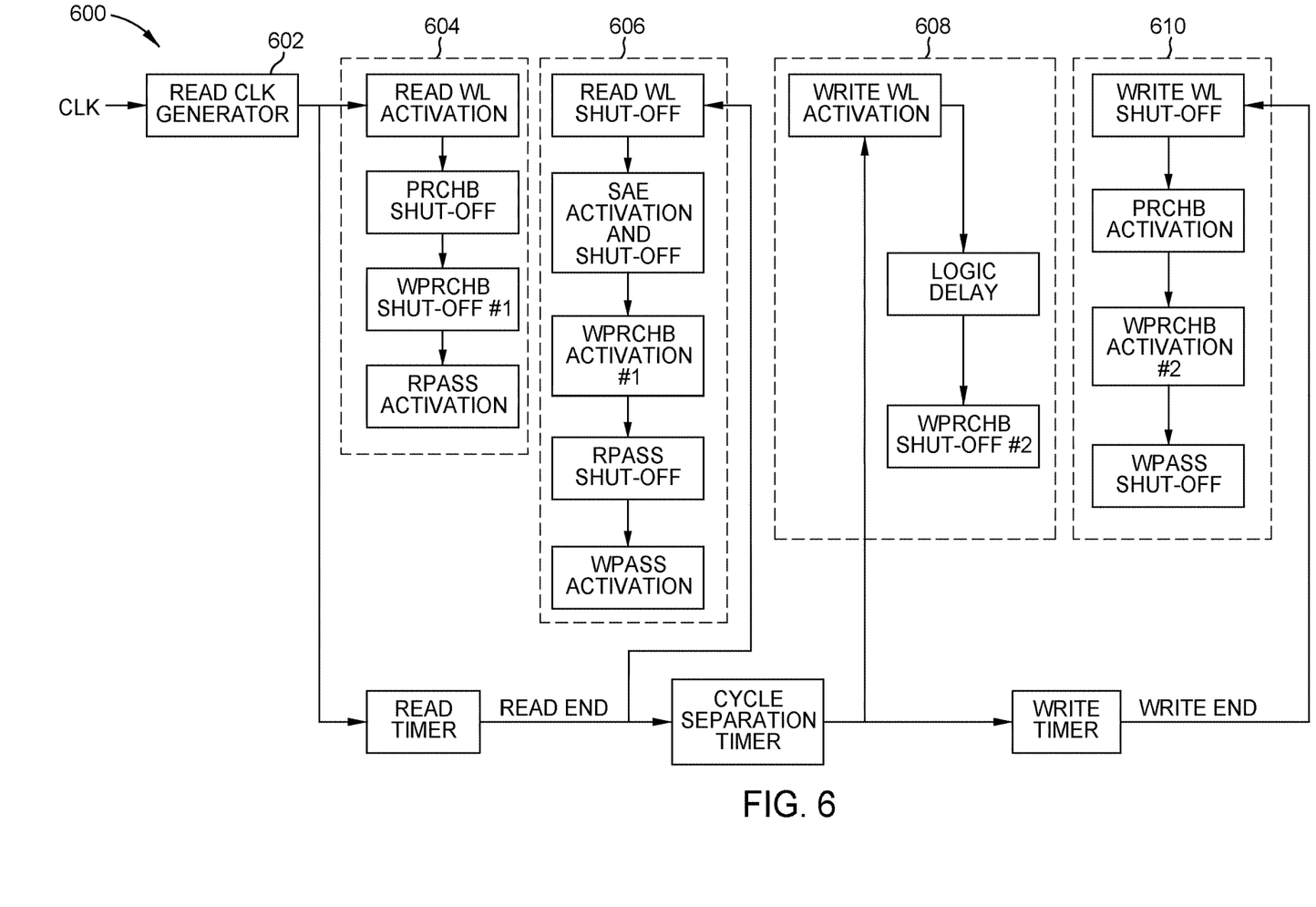
FIG. 6 illustrates an example method for writing a memory array that may be performed using the system of FIG. 1 or other suitable circuit, according to an embodiment of the present disclosure.

FIG. 6 illustrates an example method 600 that may be performed in the system 100 of FIG. 1 or other suitable circuit. Generally, the method 600 shown in FIG. 6 uses the dual pre-charge circuitry to charge bitlines for unselected columns during a write operation and to charge bitlines for selected columns after the write operation is complete. At 602, a clock signal (e.g., a Read CLK) is generated. At 604, the read operation occurs. During the read operation, Read WL activates (e.g., WL-READ in FIGS. 3 and 5 goes high), PRCHB shuts off (e.g., goes high), WPRCHB shuts off (e.g., goes high), and RPASS activates. Each of these steps may occur close in time to one another and may occur in any order.

After the read operation is complete, the intra-cycle period begins at 606. During the intra-cycle period, Read WL shuts off (e.g., WL-READ in FIGS. 3 and 5 goes low), SAE activates and shuts off to deactivate or isolate the sense-amp, WPRCHB activates (e.g., goes low), RPASS shuts off, and WPASS activates. As a result, the bitlines for the unselected columns begin to charge to $V_{DD}$ (e.g., BT1 charges). Additionally, the write operation for the selected columns may begin (e.g., BB0 begins to discharge). Each of these steps may occur close in time to one another and may occur in any order.

At 608, when BB0 has discharged near $V_{SS}$, Write WL activation occurs (e.g., WL-WRITE in FIGS. 3 and 5 goes high). WPRCHB also shuts off (e.g., goes high) during this period. In the process of FIGS. 5 and 6, WPRCHB shuts off after Write WL activation and after a logic delay. As a result, the bitlines for unselected columns continue to charge even after Write WL activation (e.g., BT1 continues to charge after WL-WRITE goes high). In the process of FIG. 3, WPRCHB shuts off shortly before or after Write WL activation without the logic delay. As a result, BT1 stops charging around the time WL-WRITE goes high.

At 610, the write operation is complete. Write WL shuts off (e.g., WL-WRITE in FIGS. 3 and 5 goes low), PRCHB activates (e.g., goes low), WPRCHB activates (e.g., goes low), and WPASS shuts off. As a result, the dual pre-charge circuits begin preparing for the next read/write cycle. Each of these steps may occur close in time to one another and may occur in any order.

Figure 7:
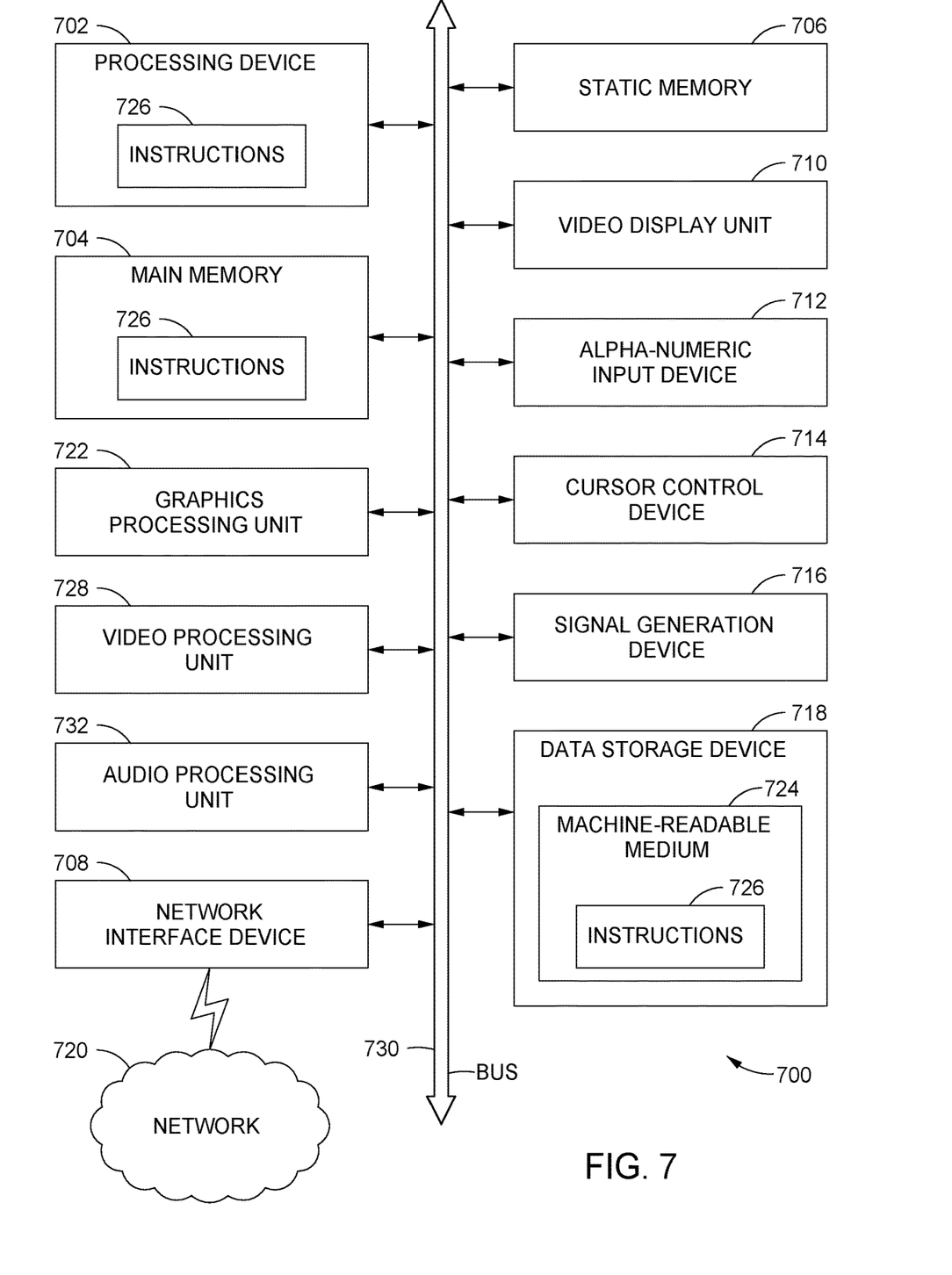
FIG. 7 depicts a diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media. The main memory 704 may incorporate the features shown in FIGS. 1-2.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A memory circuit system comprising:
   a memory array comprising (i) a first set of columns, (ii) bitlines of the first set of columns, (iii) a second set of columns different from the first set of columns, and (iv) bitlines of the second set of columns;
   a first precharge circuit electrically coupled to the memory array, wherein the first precharge circuit (i) charges the bitlines of the second set of columns of the memory array when the first set of columns are being written and (ii) causes the bitlines of the second set of columns to discharge after the bitlines of the second set of columns are charged and until the first set of columns have completed being written; and
   a second precharge circuit electrically coupled to the memory array, wherein the second precharge circuit charges the bitlines of the first set of columns after the first set of columns have completed being written.

2. The memory circuit system of claim 1, wherein the memory array is further configured to read at least one of a subset of the first set of columns or a subset of the second set of columns before the first set of columns are written.

3. The memory circuit system of claim 2, wherein reading the at least one of the subset of one or more of the first set of columns or the subset of the second set of columns and the writing of the first set of columns occur in a single clock cycle.

4. The memory circuit system of claim 2, wherein reading the at least one of the subset of the first set of columns or the subset of the second set of columns and the writing of the first set of columns are performed over a same port of the memory array.

5. The memory circuit system of claim 1, wherein the first set of columns are written after the bitlines of the first set of columns discharge.

6. The memory circuit system of claim 1, wherein the first precharge circuit and the second precharge circuit charge the bitlines of the second set of columns and the bitlines of the first set of columns, respectively, to a same voltage.

7. The memory circuit system of claim 1, wherein the first precharge circuit continues charging the bitlines of the second set of columns of the memory array after the first set of columns have completed being written.

8. A method for writing a memory array, the method comprising:
   writing a first set of columns of the memory array;
   charging, using a first precharge circuit, bitlines of a second set of columns of the memory array different from the first set of columns when the first set of columns are being written;
   causing the bitlines of the second set of columns to discharge after the bitlines of the second set of columns are charged and until the first set of columns have completed being written; and
   charging, using a second precharge circuit, bitlines of the first set of columns after the first set of columns have completed being written.

9. The method of claim 8, further comprising reading at least one of a subset of the first set of columns or a subset of the second set of columns before writing the first set of columns.

10. The method of claim 9, wherein reading the at least one of the subset of one or more of the first set of columns or the subset of the second set of columns and the writing of the first set of columns occur in a single clock cycle.

11. The method of claim 9, wherein reading the at least one of the subset of the first set of columns or the subset of the second set of columns and the writing of the first set of columns are performed over a same port of the memory array.

12. The method of claim 8, wherein the first set of columns are written after the bitlines of the first set of columns discharge.

13. The method of claim 8, further comprising charging, using the first precharge circuit and the second precharge circuit, the bitlines of the second set of columns and the bitlines of the first set of columns, respectively, to a same voltage.

14. The method of claim 8, further comprising continuing to charge, using the first precharge circuit, the bitlines of the second set of columns of the memory array after the first set of columns have completed being written.

15. A non-transitory computer readable medium storing a digital representation of a circuit, the circuit comprising:
   a first transistor connected to a bitline of a first column of a memory array; and
   a second transistor connected to a bitline of a second column of the memory array, wherein a gate of the first transistor receives a first control signal that causes the first transistor to charge the bitline of the first column when the second column is being written and causes the bitline of the first column to discharge after the bitline of the first column is charged and until the second column has completed being written, and wherein after the second column has completed being written, a gate of the second transistor receives a second control signal that causes the second transistor to charge the bitline of the second column.

16. The medium of claim 15, wherein the bitline of the second column discharges before the second column is written.

17. The medium of claim 15, wherein the first transistor continues charging the bitline of the first column while the second column is being written.

18. The medium of claim 15, wherein the first column or the second column is read before the second column is written.

19. The medium of claim 18, wherein reading the first column or the second column and the writing the second column occur in a single clock cycle.

20. The medium of claim 18, wherein reading the first column or the second column and writing the second column of are performed over a same port of the memory array.

* * * * *